United States Patent [19]

Takemae et al.

[11] 4,156,939

[45] May 29, 1979

[54] INTEGRATED SEMICONDUCTOR MEMORY DEVICE

[75] Inventors: Yoshihiro Takemae; Takeo Tatematsu; Katsuhiko Kabashima, all of Kawasaki; Tomio Nakano; Kiyoshi Miyasaka, both of Yokohama, all of Japan

[73] Assignee: Fujitsu Limited, Japan

[21] Appl. No.: 908,836

[22] Filed: May 23, 1978

[30] Foreign Application Priority Data

Jun. 10, 1977 [JP] Japan ................................. 52-69085

[51] Int. Cl.² ............................................ G11C 11/40
[52] U.S. Cl. .................................... 365/182; 365/149; 307/238
[58] Field of Search ............... 365/182, 183, 184, 185, 365/149, 150, 208; 307/238, 279

[56] References Cited

U.S. PATENT DOCUMENTS 4,112,575  9/1978  Fu et al. .............................. 365/182

Primary Examiner—Terrell W. Fears
Attorney, Agent, or Firm—Staas & Halsey

[57] ABSTRACT

An integrated semiconductor memory device is formed on a semiconductor substrate of one conductivity type on which there are provided peripheral circuits consisting of a pluality of memory cells each containing a storage capacitor and an IG FET. The IG FET in each memory cell acts as a transfer gate which is disposed on a surface region having the same conductivity type as that of the substrate and higher impurity concentrations than that of the substrate. The transfer gate has a gate threshold value which is higher than that of the IG FET in the peripheral circuits and which is insensitive to a noise pulse supplied thereto, whereby the destruction of data by noise pulse can be effectively prevented.

17 Claims, 13 Drawing Figures

INTEGRATED SEMICONDUCTOR MEMORY DEVICE

BACKGROUND OF THE INVENTION (a) Field of the Invention

This invention relates to an integrated semiconductor memory device called one transistor/cell type, including memory, each consisting of one storage capacitor and one insulated gate field effect transistor (IG FET).

(b) Description of the Prior Art

It is well known to implement a random access memory (RAM) by employing an integrated semiconductor memory device in which the IG FET is used as the principal element. Particularly, one of the most popular RAM's employs a dynamic one transistor/cell type memory device which has a memory cell consisting of one storage capacitor and one IG FET.

This one transistor/cell type memory device provides a memory function in accordance with the charges in the storage capacitor, and the IG FET in the cell functions as the transfer gate for controlling the input and output of the charges to/from the storage capacitor. In this memory cell, charge stored in the storage capacitor gradually decreases by leak charge, and generally charge is supplied to the storage capacitor via the transfer gate every so often, during a so-called "refresh" period.

The actual integrated semiconductor memory device of this type is composed of a memory cell array comprising a semiconductor substrate on which are found a number of the above-mentioned memory cells and peripheral circuits, having a decoder, a sense amplifier, a clock generator and other elements associated therewith. The peripheral circuit is principally composed of the IG FET which is substantially the same as the IG FET of the transfer gate in the memory cell.

In general, these IG FETs are designed to have a gate threshold voltage level of 1 to 1.5 V in the abovementioned memory device, considering operation speed, power consumption, noise margin, etc. This gate threshold value is a value suitable for receiving, at the input of the peripheral circuit, signal levels outside the TTL level in the range from 0.4 to 2.4 volt.

When a word line connected to the transfer gate of the memory cell is of 0 level (namely, the memory cell is in the "unselected" condition) the transfer gate is in the "nonconductive" condition, and the storage capacitor is separated from the bit line by means of the transfer gate. In the actual memory device, a low level pulsating noise is often induced on the bit line or word line during the "unselected" period. This pulsating noise can contribute to the discharge of the storage capacitor to the bit line through the transfer gate, even when its amplitude is very low. In practice, this is because the IG FET allows even a minute current to flow, even when a voltage which is considerably lower than the gate threshold is applied to the gate. This problem is not effectively remedied by giving a large capacitance value to the storage capacitor so that a little charge loss can be ignored. This is because a storage capacitor having a large capacitance value requires a wider area of the substrate, and this brings deterioration of the integration density of the memory device.

A pulsating noise on the bit line or word line is, for example, induced when the other bit line or word line transition between the "unselected" and "selected" condition. In the practical memory device, in which the gate threshold of the transfer gate is in the range from 1 to 1.5 volt, it has often been observed that data is destroyed as a result of the above-mentioned phenomenon.

SUMMARY OF THE INVENTION

An object of this invention is to provide a memory device which does not easily experience destruction of data due to noise.

Another object of this invention is to provide a memory device which does not easily experience destruction of data, even when the memory cell has a storage capacitor with a small capacitance value.

A further object of this invention is to provide an integrated semiconductor memory device having a memory cell which is insensitive to noise pulses, even when the IG FET's comprising the peripheral circuits have comparatively low and optimum gate threshold values.

A memory device according to this invention comprises peripheral circuits composed of IG FET's formed on a semiconductor substrate having a given conductivity type, a storage capacitor and a memory cell consisting of a transfer gate composed of an IG FET. This transfer gate is disposed on a region having the same conductivity type as that of the substrate, and having an impurity concentration higher than that of the substrate. In this memory device, the gate threshold value of the transfer gate is higher than that of IG FET used in the peripheral circuit. The difference in these threshold values is typically about 1 volt, and this makes the transfer gate of memory cell insensitive to a very low amplitude noise pulse. The transfer gate is electrically connected in series to the storage capacitor having a metal-insulator-semiconductor structure. In practical terms, the IG FET composing the transfer gate is such that the path between its source and drain is substantially maintained in the perfectly non-conductive condition, even when a noise pulse of about 1 volt is applied across the source and thus gate, and the storage capacitor is perfectly isolated from the bit line. Therefore, discharge of the storage capacitor to, or in-flow of charge to the storage capacitor from, the bit line is effectively prevented.

On the other hand, the IG FET comprising the transfer gate generates a voltage loss in the occasion of giving bit line potential to the storage capacitor. Namely, the voltage which is applied to the storage capacitor is lower than the voltage to be applied to the gate of the IG FET by just the amount of the gate threshold voltage of the IG FET. Therefore, the read out of data from memory cell is hampered because it is difficult to excessively raise the gate threshold of the transfer gate. However, in the case of a typical memory device, the power supply voltage $V_{DD}$ of 12 volt is provided as the voltage input to the gate terminal of the transfer gate and, for this reason the increment of about 1 volt of the gate threshold level of the transfer gate will not have any substantial harmful influence on the function of the memory cell. Thus, according to this invention, the IG FET composing the transfer gate has a higher gate threshold voltage than that of the IG FET used for the peripheral circuit by a value which is comparable with the amplitude of the noise pulse which may be induced on the bit line or word line, and is sufficiently lower than the power supply voltage.

An increase of the gate threshold level can also be realized by making the gate insulating film thicker.

However, this means is inadequate to attain the purpose of this invention because, when the IG FET has a thicker gate insulating film, it is easily susceptible to the back gate effect. As a result, the operation margin is made small and the read operation of the memory cell becomes difficult.

The integrated semiconductor memory device of this invention can substantially be manufactured by a manufacturing process in which one rough masking step and one impurity doping step are added to the conventional memory device manufacturing process.

Further objects and features of this invention will be made clear from an embodiment described below.

DETAILED DESCRIPTION OF THE INVENTION

Figure 1:
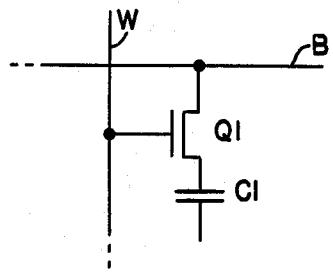
FIG. 1 shows an equivalent circuit of the conventional one transistor/cell type memory cell.

Referring to FIG. 1 there is shown an equivalent circuit of the typical one transistor/cell type memory cell of the prior art. The source and drain of the IG FET Q1 (transfer gate) are connected in series between the capacitor C1 and the bit line B, and simultaneously its gate is connected to the word line W. The storage capacitor C1 stores charge in accordance with the data to be stored. The transfer gate Q1 electrically connects or disconnects the storage capacitor C1 and the bit line B in accordance with the level of word line W, thereby controlling charging or discharging of the storage capacitor C1 in accordance with the word line (W) level.

Figure 2:
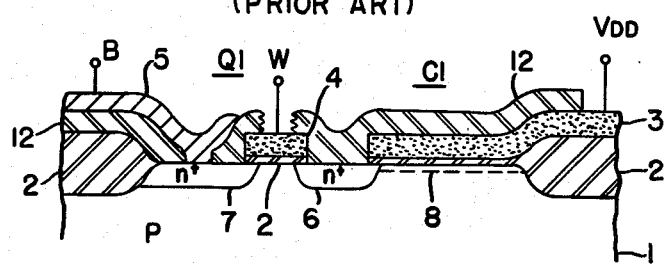
FIG. 2 shows a configuration of cross-section of the conventional one transistor/cell type memory cell.

FIG. 2 shows an example of the specific cross-section configuration of the memory cell shown in FIG. 1. On the silicon substrate 1 of p type, the electrodes 3, 4, 5 are formed adjacent to the insulation film 2, and the n+ regions for source and drain regions 6, 7 are formed in the substrate 1. The electrode 3 is connected to a power supply which supplies a positive voltage of $V_{DD}$, inducing the n-type inversion layer 8 at the substrate surface 1 under the electrode 3. The electrode 3 and the inversion layer 8 are positioned face to face with a thin insulation film 2 therebetween, and these three elements form the storage capacitor C1. The electrode 4 is a gate electrode which, together with the thin insulation film 2 under the said electrode and the n+ type regions 6, 7, forms the IG FET Q1 (transfer gate). The gate electrode 4 is connected to the word line W. The electrode 5 extending above the insulation film 12 comes into contact with the n+ region 7 is connected to the bit line B. The n+ region (source electrode) 6 comes into contact with the inversion layer 8, but this contact can be omitted if the electrode 3 is disposed contiguous to the gate electrode 4.

An integrated memory device including a plurality of the memory cells shown in FIG. 1 and FIG. 2 practically includes peripheral circuits which are composed of a number of IG FETs. The transfer gate Q1 of the memory cell is generally manufactured by the same process as the IG FET to be used in the peripheral circuit. Therefore, in the prior art, the gate threshold of transfer gate Q1 is equal to that of the IG FET used in the peripheral circuit. In the peripheral circuit, a comparatively low gate threshold as low as 1 to 1.5 V is optimum for practical operation as the threshold level of the IG FET. This value is suitable for obtaining sufficient noise margins in practical operation while realizing high speed operation and, at the same time, low power consumption of the peripheral circuit. Such a value is also adopted for accepting a TTL input from the external circuit having a level of 0.4 to 2.4 volt.

However, this gate threshold value is insufficient for the transfer gate in the memory cell. In the actual IG FET, a little current flows between the source and drain regions even when a voltage which is considerably lower than the gate threshold is applied to the gate electrode of the IG FET. In the case of a practical integrated semiconductor memory device including peripheral circuit and a number of memory cells, it is inevitable that a pulsating noise having a very low amplitude is generated on the bit line or word line at the time of operation in the non-selected condition. This pulsating noise causes a very low level current to flow through the source and drain regions 6, 7 at the transfer gate Q1. Moreover, this current is sufficiently large to cause the charges stored in the inversion layer 8 to be discharged toward the bit line B within a very short period. This pulsating noise inversely allows the charges on the bit line to be transferred into the storage capacitor, charging this capacitor which was heretofore not charged. As a result of this, the data stored in the capacitor is destroyed. It has been confirmed that the memory cell disclosed in the prior art, which cell includes the transfer gate having the gate threshold level of 1 to 1.5 volt, easily experiences this destruction of data as mentioned above.

The manufacturing process of an embodiment of this invention will be described hereunder by referring to FIGS. 3 to 8.

In these figures, cross-sectional configuration of only a part of the memory device of this invention is shown in series along the manufacturing process. In these figures, MC side indicates one of the memory cells, while PC side indicates one of the IG FETs which form the peripheral circuit.

Figure 3:
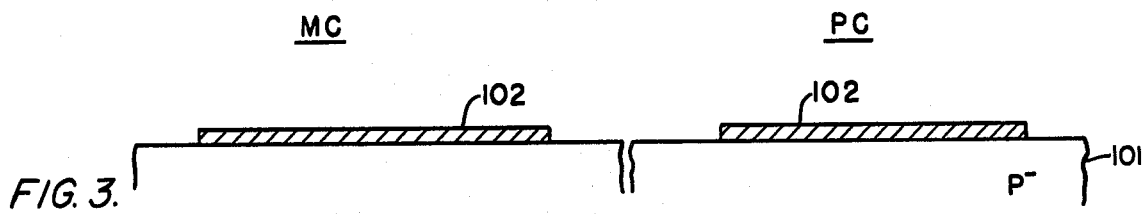
FIGS. 3 to 8 show cross-sections of a memory device in the course of the manufacturing process according to an embodiment of this invention.
Figure 4:
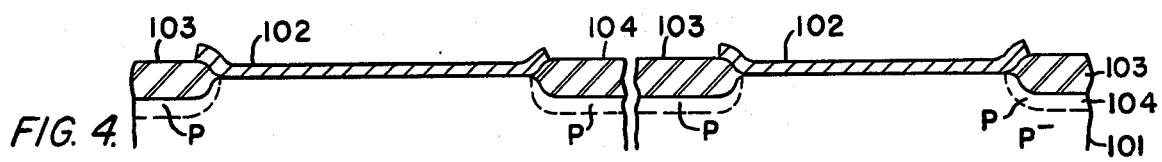

In the first step shown in FIG. 3, the surface area on the p type silicon substrate 101 in which elements are to be formed is coated with the silicon nitride film 102. Impurity concentration of the p type substrate 101 ranges from $10^{14}$ to $10^{15}$ cm$^{-3}$. The silicon nitride film 102 has a thickness of 1000 Å. Next, the boron ion (B+) is implanted into the substrate 101 using the silicon nitride film 102 as a mask, and thereafter, thermal oxidation is performed on the substrate. As a result, as shown in FIG. 2, the field oxide film 103 consisting of silicon dioxide is formed on the surface of the substrate 101 except for the area coated with the silicon nitride film 102. Here, the abovementioned thermal oxidation condition is adjusted so that the thickness of the silicon dioxide film 103 becomes about 1 μm. Under the silicon dioxide film 103, the p type region 104 is formed as a result of the abovementioned boron ion implantation. This p type region 104, in the end, functions as the well known channel cut region.

Then, the silicon nitride film is removed and thermal oxidation is performed again on the substrate 101. As a result of this treatment, the silicon dioxide film 106 is formed on the surface of the substrate 101 in the area to which the IG FET should be formed, with a thickness of 1000 Å. This thin silicon dioxide film 106, in the end, functions as the gate insulating film.

Figure 5:
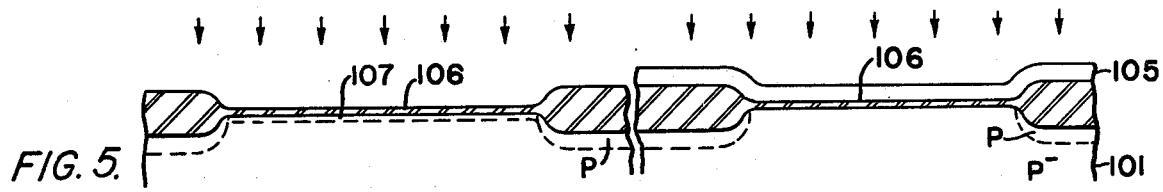

With reference to FIG. 5, the masking layer 105 of photo-resist is formed on the substrate to expose the memory cell area MC and to cover the peripheral circuit area PC. Here, implantation of boron ion (B+) is carried out for the substrate 101. The photo-resist layer 105 has a thickness sufficient for preventing the boron ions from reaching the surface of substrate 101, and as a result the boron ions are not introduced into the substrate 101 surface in the peripheral circuit area PC. On the other hand, in the memory cell area MC, the boron ions are introduced into the substrate 101 surface through the silicon dioxide film 106 of the thickness of 1000 Å and thereby form a thin p type region 107. At this time, the ion implantation condition is adjusted so that the p type impurity is implanted only to a concentration range of 1 to $3 \times 10^{11}$ cm$^{-2}$ at the substrate surface in the memory cell area MC.

Figure 6:
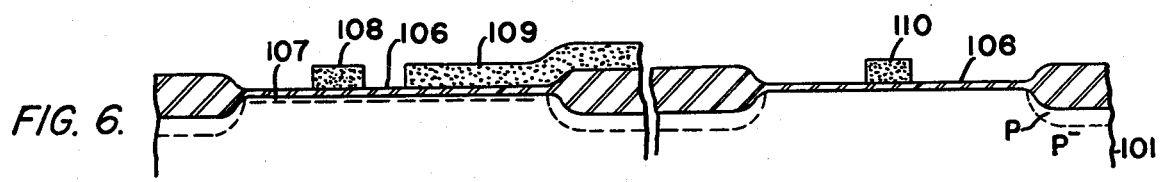

With reference to FIG. 6, after the photo-resist layer 105 is removed, a polycrystal silicon layer 108, 109, 110 is formed on the substrate. These polycrystal silicon layers 108, 109, 110 respectively form the gate electrode of the transfer gate (IG FET) in the memory cell, the electrode for forming the storage capacitor, and the gate electrode of the peripheral circuit (IG FET).

Figure 7:
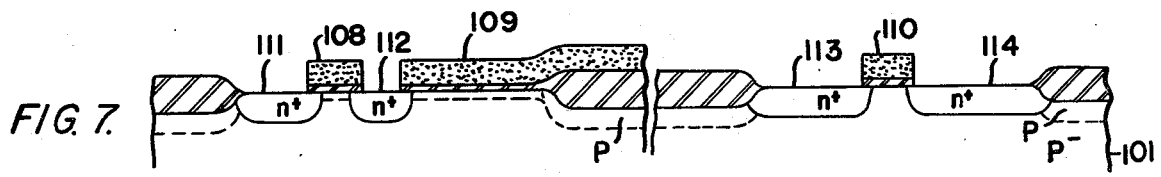

In the step shown in FIG. 7, the thin silicon dioxide film 106 is etched using the polycrystal silicon layers 108, 109 and 110 as a mask, and then high concentration diffusion treatment of an n type impurity is carried out on the substrate. As a result, the n+ type regions 111, 112, 113, 124 having high concentration are formed, defining the source and drain regions 111 and 112 of the transfer gate in the memory cell (IG FET), and the source and drain regions 113 and 114 of the peripheral circuit (IG FET).

Figure 8:
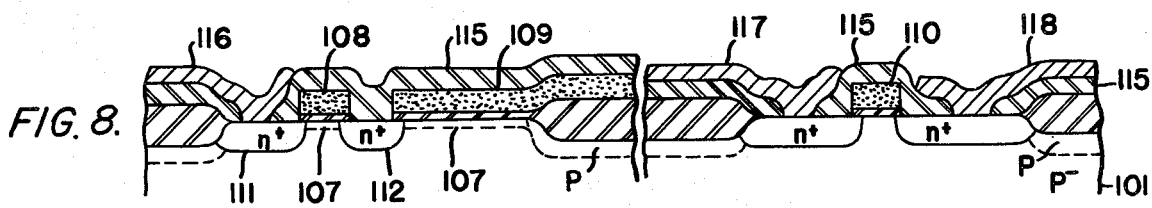

With reference to FIG. 8, the phosphor silicate glass (PSG) film 115 is deposited on the substrate 101, and the electrode window is formed. Thereafter, the aluminium electrodes 116, 117, 118 are formed. Thus, the memory device related to this invention is completed.

The memory device of this invention shown in FIG. 8 is substantially different from the memory device of the prior art, (FIG. 2) in that the impurity concentration at the substrate surface 101 under the gate electrode 108 of the IG FET in the memory cell MC is higher than that of the IG FET for peripheral circuit PC. This difference is derived from the p type region 107 formed by the boron ion implantation shown in FIG. 5 and it a gate threshold for the memory cell IG FET which is about 1 volt higher than that for the peripheral circuit IG FET. As a result, the IG FET in the memory cell area MC has a gate threshold of about 2 volt below the back gate bias of −5 V which is ordinarily applied, and the IG FET in the peripheral circuit area PC has a gate threshold of about 1 volt below this back gate bias condition.

Within the memory cell, the shallow p type region 107 is also formed by the boron ion implantation at the substrate 101 surface under the electrode 109 which forms part of the storage capacitor. The threshold level allowing formation of the n type inversion layer at the substrate 101 surface under the electrode 109 is also about 2 volt, but since the electrode 109 is supplied with the power supply voltage $V_{DD}$ of 12 volt, the inversion layer for the storage capacitor can be formed with certainty. This storage capacitor has, for example, an area of 100 μm$^2$ and as a result a capacitance value of about 0.3 pF.

In the case of the standard memory device of which power supply voltage $V_{DD}$ is 12 volt, a voltage of −5 volt is applied to the substrate as the back gate bias, and in this condition, the IG FET of which source region is grounded has the gate threshold of about 1 volt or 2 volt as described above. When the potential of the source region changes, the effective back gate bias also changes. As a result, the gate threshold also changes. Thus, the gate threshold increases with increment of the effective back gate bias. An IG FET having its gate formed on the substrate surface, of which the impurity concentration is increased, shows less variation of gate threshold for the viariation of back gate bias than that of an IG FET having a thick gate insulation film. Describing this more specifically, the IG FET in the peripheral circuit area PC has a gate threshold of about 1 volt at the back gate bias of −5 volt and also has a gate threshold of about 0.1 volt when the back gate bias is zero (0). On the other hand, the IG FET in the memory cell area MC has a gate threshold of about 2 volt at the back gate bias of −5 volt, and has a gate threshold of about 1.2 volt when the back gate bias is zero (0). However, if it is supposed that an IG FET which is similar to that in the peripheral circuit area PC has a gate oxide film of the thickness of 2000 Å, only a gate threshold of about 0.3 volt can be obtained when the back gate bias is zero (0), even when the gate threshold is about 2 volt at the back gate bias of −5 volt. Furthermore, in the case of this IG FET, if the potential of the source region becomes 8 volt and, as a result, a back gate bias of 13 volt is applied, the gate threshold becomes about 4 volt.

It is not adequate for accomplishing the object of this invention to provide an IG FET having such a thick gate insulation film as the transfer gate of the memory cell. This is because, when the back gate bias decreases, the transfer gate becomes more sensitive to pulsating noise. In addition, the fact that the transfer gate has a high gate threshold at an effectively high back gate bias means that a sufficient amount of charge cannot be given to the storage capacitor from the bit line. This is because, when a high voltage from the bit line is applied to the storage capacitor, an effectively high back gate bias is applied to the transfer gate, and the IG FET can give to its source only a voltage, which is lower, by the amount of the gate threshold voltage, than the voltage to be applied to its gate.

The transfer gate according to this invention shown in the memory cell area MC of FIG. 8 has the gate threshold higher than 1 volt even when the back gate bias is zero, and is not too sensitive to pulsating noise, even under a low back gate bias. Moreover, this transfer gate can give a sufficiently high potential to the storage capacitor from the bit line even under a high back gate bias, having little harmful influence on the write and read operations. In more specific terms, this transfer gate has a gate threshold of about 3 volt when its source voltage is 9 volt, and therefore its effective back gate voltage is 14 volt. Namely, this transfer gate can give a potential up to about 9 volt to the storage capacitor, when the power supply voltage $V_{DD}$ of 12 volt is applied to its gate.

Utility of the memory device of this invention will become more clear from the specific overall configuration and description of its operation indicated below.

Figure 9:
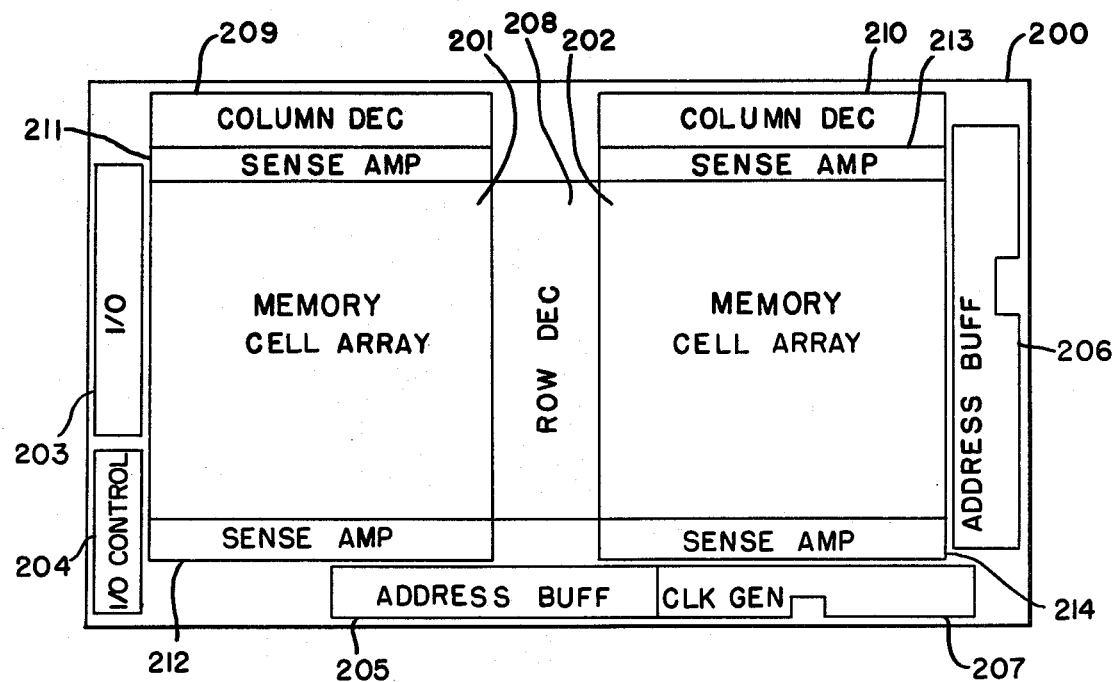
FIG. 9 shows a lay-out of the integrated semiconductor memory device of an embodiment of this invention.

FIG. 9 shows the layout of the memory cell array and the peripheral circuit of the practical integrated semiconductor memory device. A pair of memory cell arrays 201, 202 are disposed around the center of the semiconductor memory chip 200 surface. Each memory cell array 201, 202 respectively includes a number of memory cells. The peripheral circuit includes the input and output circuit 203, input and output controller 204, address buffers 205, 206, clock generator 207, row decoder 208, column decoders 209, 210 and sense amplifiers 211, 212, 213, 214. The peripheral circuit controls the read, write operations of the device 200.

Figure 10:
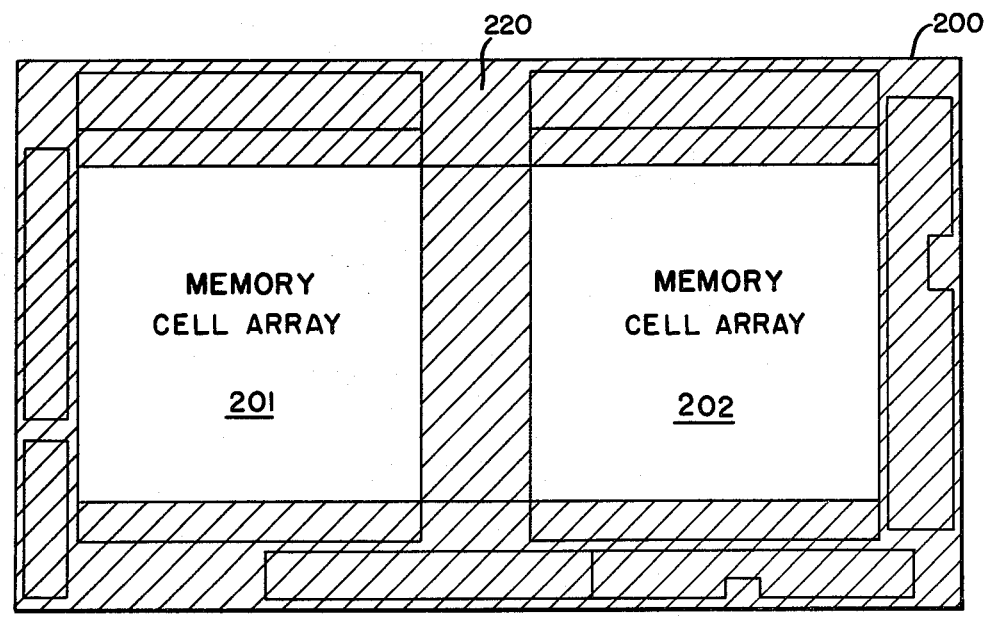
FIG. 10 shows a masking pattern in the masking process which is adopted according to an embodiment of the present invention.

With reference to FIG. 10, the masking pattern 220 of the photo-resist layer 105 in the ion implantation process in FIG. 5 is shown. The masking pattern 220 covers the whole area of the surface of the chip 200, excluding the memory cell array areas 201, 202, and does not have a complicated pattern. Therefore, alignment of the masking process can be done easily.

Figures 11, 13:
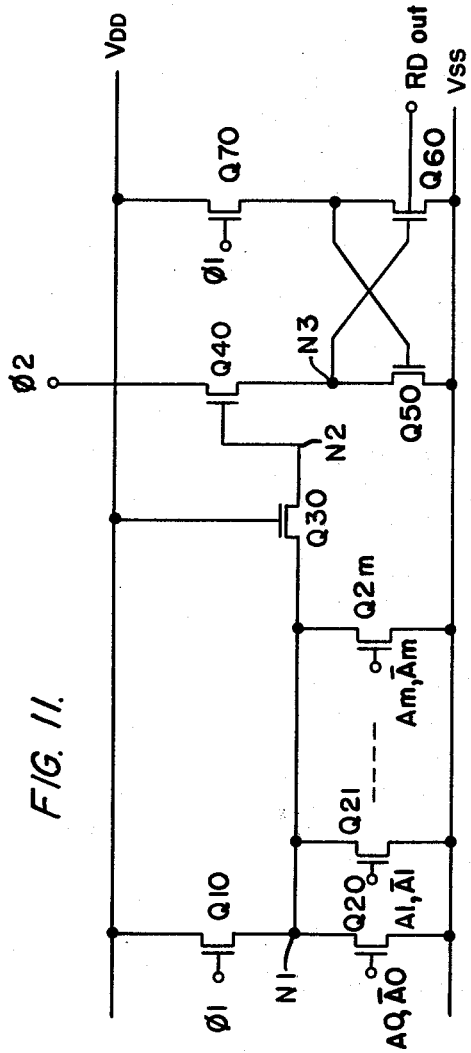
FIG. 11 shows a part of the decoder circuit to be built in the integrated semiconductor memory device according to an embodiment of this invention.
FIG. 13 shows a timing chart corresponding to the circuit in FIGS. 12 and 13.

FIG. 11 shows a unit decoder circuit to be built in the row decoder 208. This decoder circuit is the well known type which is composed of the IG FETs Q10 to Q70. To the gates of the decode transistors Q20, Q21, ..., Q2m, a particular combination of m address signals $\overline{A0}$ to $\overline{Am}$, or A0 to Am is applied. In the row decoder 208, N unit decode circuits shown in FIG. 11 are built ($N = 2^m$), and the output of only one decode circuit becomes high level in response to a particular combination of address signals.

Figure 12:
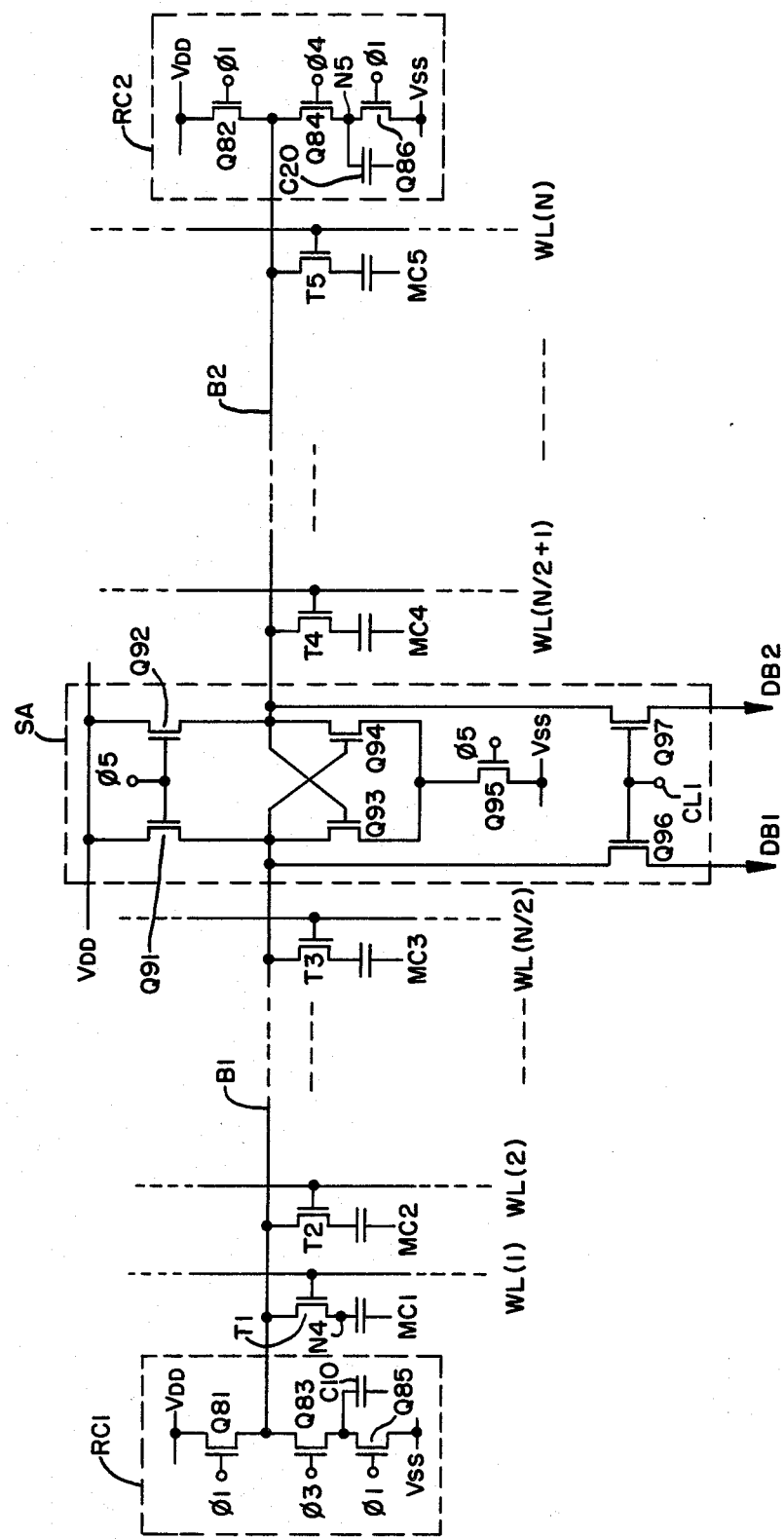
FIG. 12 shows the memory cells and a part of the sense amplifier circuit to be built in the integrated semiconductor memory device according to an embodiment of this invention.

FIG. 12 shows the memory cell groups MC1 to MC5 disposed along a pair of bit lines B1, B2, and the sense amplifiers system consisting of the sense amplifier circuit SA and reference circuits RC1, RC2. The number of memory cells MC1 to MC5 disposed along the bit lines B1, B2 is equal to the number (N) of the word lines WL (1) to WL (N). Each word line WL (1) to WL (N) is respectively connected to one of the output terminals of N decode circuits in the row decoder 208. The sense system consisting of the sense amplifier circuits SA and reference circuit RC1, RC2 is disposed within the sense amplifiers 211, 212, 213 214 in FIG. 9, and it is also well known type. Of course, in the memory cell array areas 201, 202 in FIG. 9, a large number of circuits disposed along the bit lines B1, B2 shown in FIG. 12 are arranged.

According to an embodiment of this invention, the IG FETs Q81 to Q98 disposed within the peripheral circuit area have a gate threshold of about 1 volt, while the transfer gates T1 to T5 within the memory cell MC1 to MC5 have a gate threshold of about 2 volt.

By referring to FIG. 13 which shows the timing chart of the circuit shown in FIG. 11 and FIG. 12, circuit operation will be explained below.

In the row decoder shown in FIG. 11, the clock $\phi_1$ is in the high level which is equal to the power supply voltage $V_{DD}$ of 12 volt, while the clock $\phi_2$ is in the low level. Therefore, the node N1 has a level of about 10 volt which is lower than the power supply voltage $V_{DD}$ by an amount as much as the threshold of transistor Q10. The level of clock $\phi_1$ decreases in accordance with an external strobe pulse (sampling pulse) and the transistor Q10 is in the cut-off condition. At the same time as this, a particular combination of the address signals A0 to Am or $\overline{A0}$ to $\overline{Am}$ is applied to the gate of the decode transistors Q20, ..., Q2m. The node N1 is maintained at a level of 10 volt only at those decoder circuit wherein the address signal is in the low level. At the non-selected decoder circuit, the level of the node N1 and N2 decreases as in the case of the curves N1', N2' shown in FIG. 13.

Here, the clock $\phi_2$ increases, also increasing the level of node N2 by the bootstrap effect of the transistor Q40. With the level being up of the node N1, the transistor Q30 electrically separates the node N2 from the node N1. Thereby, at the selected decoder circuit, the gate level of transistor Q40 is sufficiently raised above the power supply voltage $V_{DD}$, and the node N3 is increased to a level of voltage $V_{DD}$ of 12 volt; thus, a level of 12 volts is given to the selected word line WL from the output terminal RD$_{out}$.

The cross-coupled transistors Q50 and Q60 have the function of cramping the level of node N3 to the level of $V_{ss}$ (equals to 0) in the non-selected condition. In other words, initially, the transistor Q70 is in the conductive condition, while the transistor Q50 is in the conductive condition, and the transistor Q60 is in the non-conductive condition. After the clock $\phi_1$ decreases, and only when a sufficiently high level is given to the node N3, the cross-coupled transistors Q50 and Q60 are inverted, giving the high level to the word line WL via RD$_{out}$.

However, since the impedance of transistor Q50 in the conductive condition is not sufficiently low, a minute noise pulse can also be given to the non-selected word line. In FIG. 13, an example of this noise pulse is shown by the curve 300. This noise pulse 300 is generated when the clock $\phi_2$ increases before the level of node N2 decreases sufficiently, causing the transistor Q40 to become conductive for a short period of time.

Now, read out operation will be explained by referring to FIG. 12 and FIG. 13. Here, selection of word line WL (1) will be explained.

In the initial condition, the clock $\phi_1$ is in the high level, and clocks $\phi_3$, $\phi_4$, $\phi_5$ in the low level. The transistors Q81, Q82 in the reference circuits RC1, RC2 are in the conductive condition and the bit lines B1, B2 are in a level which is lower than the power supply voltage $V_{DD}$ by an amount as much as the gate threshold voltage of transistors Q81 and Q82, namely in the level of about 10 volt.

In the reference circuit RC1, RC2, dummy cells consisting of the dummy capacitors C10 or C20 and transistors Q83 or Q84 are respectively provided. The dummy capacitors C10 and C20 are discharged in the initial condition by the transistors Q85, Q86. The dummy capacitors C10, C20 have a half capacitance value, namely about 0.15 pF, as compared with the storage capacitor of the memory cell.

Here, the level of clock $\phi_1$ decreases but, since the bit lines B1, B2 are in the floating condition, its potential is maintained as it is.

Next, a voltage of 12 volt is given to the word line WL (1) from the decoder circuit shown in FIG. 11, causing conduction of the transfer gate T1 of the memory cell MC1. At this time, a noise pulse indicated by the curve 300 in FIG. 13 may be given to the word lines WL (2) to WL (N) from the other decoder circuits, but according to this invention, the transfer gates T2 to T5 of the memory cells MC2 to MC5 have respective thresholds of about 2 volt and each gate is perfectly maintained in the non-conductive condition. On the other hand, at the memory cell MC1, the transfer gate T1 becomes conductive, and charge on the bit line B1 flows into the storage capacitor. As a result, the potential of the bit line B1 decreases. If charges are not stored in the storage capacitor of the memory cell MC1, namely if "0" is written, decrease of potential on the bit line B1 is comparatively large. In this case variation of potential at the bit line B1 is indicated by the curve B1 in FIG. 13. On the contrary, if this storage capacitor is charged, namely "1" is written, decrease of potential in the bit line B1 is comparatively small. This variation of potential is indicated by curve B1' in FIG. 13. The following explanation is directed to such a case where the storage capacitor of memory cell MC1 is discharged at the initial state. Deterioration of potential of the bit line B1 is determined by the ratio of the stray capacitance of the bit line B1 and capacitance of the storage capacitor. Potential variation of the node N4 connected to the storage capacitor of the memory cell MC1 is indicated by the curve N4 in FIG. 13. With increase of the potential of node N4, an effective back gate bias of the transfer gate T1 also increases, but increment of the gate threshold of the transfer gate T1 is comparatively small. Therefore, the transfer gate T1 is capable of shifting the charges on the bit line B1 to the storage capacitor until the potential of the node N4 increases sufficiently. This means larger variation of the bit line potential can be attained.

Meanwhile, simultaneously with increase of the level of the word line WL (1), the level of the clock $\phi_4$ to be applied to the gate of transistor Q84 in the dummy cell C20, Q84 of the reference circuit RC2 also increases, causing conduction of the transistor Q84. Since the dummy capacitor C20 is discharged in the initial condition, the potential of the bit line B2 gradually decreases. Voltage variation of the bit line B2 is shown by the curve B2 in FIG. 13, while voltage variation of the node N5 connected to the dummy capacitor C20 is indicated by the curve N5. Since the stray capacitance of both bit lines B1 and B2 is almost the same and the dummy capacitor C20 has a capacitance which is a half of the storage capacitor of the memory cell, voltage drop of the bit line B2 is about half of that of the bit line B1.

The dummy cell C10, Q85 in the reference circuit RC1 operates when any of the word lines WL (N/2+1) to WL (N) is selected, however; the clock $\phi_3$ is maintained at a low level and is not related to the operation.

Then, a level of the clock $\phi_5$ increases in the sense amplifier SA and transistors Q91, Q92 and Q95 become conductive. Thus, the latch circuit consisting of the cross-coupled transistor pair of Q93, Q94 operates and thereby increasing the potential difference of the bit lines B1 and B2 gradually.

Thereafter, a high level signal is given to the column line CL1 in FIG. 12 from the column decoder circuit 209, 210 (FIG. 9) which by the way has the same configuration as the row decoder circuit shown in FIG. 11, except for the clock timing. Thus, the transistors Q96 and Q97 become conductive, and the level of the bit lines B1, B2 is transmitted to the data bus DB1, DB2. Here, read out operation is completed.

Write operation can be realized by provision of a high level or low level signal to the bit lines B1, B2 from the data bus DB1, DB2 in accordance with the data to be written. Then, the transfer gate of the memory cell connected to the selected word line becomes conductive, giving a potential corresponding to the bit line level to the storage capacitor.

In the case of the memory device of this invention, the IG FET forming the transfer gate of the memory cell has a comparatively high gate threshold, and data stored in the storage capacitor is not easily destroyed, even when a pulsating noise is applied to its gate. Moreover, since this transfer gate shows only a little variation of gate threshold for the effective back gate bias, it will be apparent from the description of the above-mentioned operation that adverse influence on the read and write operations is little.

On the other hand, in the peripheral circuit, the IG FET forming the circuit has comparatively low gate threshold value which is optimum for power consumption, operation speed, noise margin and coupling with external circuitry.

Referring to FIG. 9, detailed description of the input and output circuit 203, input and output controller 204, address buffers 205, 206 and clock generator 297 in the peripheral circuit is omitted, but these circuits can be operated without relation to the gate threshold value of transfer gate in the memory cell, and thus they may be conventional type circuits.

Numerous modifications and adaptations of the system of the invention will be apparent to those skilled in the art and thus it is intended by the appended claims to cover all such modifications and adaptations which fall within the true spirit and scope of the invention.

What is claimed is:

1. An integrated semiconductor memory device formed on a surface of a semiconductor substrate for storing information to be stored, which comprises:
    a first area of said surface of said substrate having a given impurity concentration,
    a second area of the surface of said substrate having a higher impurity concentration than the given impurity concentration of said first area at the surface of the substrate,
    a storage capacitor formed in said second area for storing a charge according to said information to be stored,
    a transfer gate formed on said second area, connected to said storage capacitor, and comprising an insulated gate field effect transistor, and
    a peripheral circuit formed on said first area of said surface of said substrate, said peripheral circuit being composed of an insulated gate field effect transistor, said transfer gate having a higher gate threshold value than that of said insulated gate field effect transistor of said peripheral circuit, whereby the memory device is immune from pulsating noise.

2. A memory device according to claim 1, wherein said storage capacitor has a metal-insulator-semiconductor structure.

3. A memory device according to claim 1, wherein said peripheral circuit is connected to a power supply which provides a voltage enough to make said transfer gate conductive.

4. A memory device according to claim 1, wherein said substrate is supplied with a back gate bias which provides desired gate threshold values of said transfer gate and said insulated gate field effect transistor of said perpheral circuit.

5. An integrated semiconductor memory device formed on a surface of a semiconductor substrate, which comprises:

a peripheral circuit area of said surface of said substrate having a given impurity concentration, a memory cell area of the surface of said substrate having a higher impurity concentration that the given impurity concentration of said peripheral circuit area at the surface of the substrate, a peripheral circuit being disposed on said peripheral circuit area and comprising a plurality of insulated gate field effect transistors, each of said transistors having a first gate threshold value, and a memory cell array having a plurality of memory cells disposed on said memory cell area, each of said memory cells comprising a storage capacitor and a transfer gate connected in series, and said transfer gate comprising an insulated gate field effect transistor which has a second gate threshold value higher than said first gate threshold value, whereby said transfer gate is immune from pulsating noise.

6. An integrated semiconductor memory device, which comprises:

a semiconductor substrate of a first conductivity type, said semiconductor substrate including first and second regions of said first conductivity type having higher impurity concentrations than that of said substrate, a storage capacitor formed on said first region, a transfer gate formed on said first region of said semiconductor substrate, and comprising a first insulated gate field effect transistor which has a first region of a second conductivity type opposite to said first conductivity type and a gate electrode, said transfer gate being connected to said storage capacitor electrically in series, a bit line connected to said first region of said second conductivity type of said transfer gate, a word line connected to said gate electrode of said transfer gate, and a peripheral circuit formed on said second regin of said semiconductor substrate, and including a decoder circuit connected via said transfer gate to said word line and a sense amplifier circuit connected via said transfer gate to said bit line, each of said decoder circuit and said sense amplifier circuit comprising a plurality of second insulated gate field effect transistors formed on said substrate, said first insulated gate field effect transistor having a higher gate threshold value than said second insulated gate field effect transistor, whereby said transfer gate is immune from pulsating noise.

7. A memory device according to claim 6, wherein said first and second insulated gate field effect transistors include respective gate insulating films of the same thickness.

8. A memory device according to claim 6, wherein said first insulated gate field effect transistor has a gate threshold value of about 2 volts and said second insulated gate field effect transistor has a gate threshold value of about 1 volt.

9. A memory device according to claim 8, wherein said substrate is supplied with a back gate bias of −5 volts, whereby said first and second insulated gate field effect transistors have said respective gate threshold values.

10. An integrated semiconductor memory device for storing information to be stored in accordance with signals received over a word line and a bit line, said device comprising:

a substrate including a memory cell region and a peripheral circuit region, said memory cell region and said peripheral circuit region being doped, said memory cell region having a higher impurity concentration from doping than the impurity concentration from doping of said peripheral circuit region, transfer gate means formed on said substrate in said memory cell region, connected to said word line and bit line, and responsive to said signals received on said word line and said bit line for transferring said information to be stored into said memory cell region, storage capacitor means adjacent to said transfer gate means for storing said information to be stored after transfer into said memory cell region by said transfer gate means, and control means formed in said peripheral circuit region for controlling the transfer into said memory cell region of said information to be stored and the storage of said information to be stored by said capacitor means.

11. A memory device according to claim 10, wherein said transfer gate means comprises an insulated gate field effect transistor.

12. A memory device according to claim 10, wherein said storage capacitor means comprises a metal-insulator-semiconductor capacitive structure.

13. A memory device according to claim 10, wherein said memory cell region comprises a plurality of memory cells, said signal received over said word line indicating a selected one of said memory cells in which information is to be stored, said signal received over said bit line comprising said information to be stored, and wherein said control means comprises a decoder circuit connected via said transfer gate means to said word line for receiving and decoding said signal from said word line to determine said selected one of said memory cells in which said information is to be stored, said control means further comprising a sense amplifier circuit connected via said transfer gate means to said bit line for receiving and sensing said signal comprising said information to be stored.

14. A memory device according to claim 13, wherein said decoder circuit and said sense amplifier circuit each comprises a plurality of second insulated gate field effect transistors formed on said substrate.

15. A memory device according to claim 14, wherein said first insulated gate field effect transistor has a higher gate threshold value than said second insulated gate field effect transistor, whereby said transfer gate is immune from pulsating noise.

16. A memory device according to claim 15, wherein said first and second insulated gate field effect transistors include respective gate insulating films of the same thickness.

17. A memory device according to claim 16, wherein said substrate is supplied with a back gate bias of −5 volts, whereby said first and second insulated gate field effect transistors have said respective gate threshold values.

* * * * *

UNITED STATES PATENT AND TRADEMARK OFFICE
CERTIFICATE OF CORRECTION

PATENT NO. : 4,156,939
DATED : May 29, 1979
INVENTOR(S) : Takemae et al

It is certified that error appears in the above-identified patent and that said Letters Patent are hereby corrected as shown below:

Col. 1, line 39, "abovemen" should be -- above-men- --;
\*Col. 5, line 1, "abovementioned" should be -- above-mentioned --;
\*Col. 5, line 5, "abovementioned" should be -- above-mentioned --;
\*Col. 5, line 52, "aluminium" should be -- aluminum --;
\*Col. 6, line 27, "viariation" should be -- variation --;
\*Col. 8, line 9, "circuit" should be -- circuits --;
  Col. 10, line 68, "perpheral" should be -- peripheral --.

Signed and Sealed this

Sixth Day of November 1979

[SEAL]

Attest:

RUTH C. MASON
*Attesting Officer*

LUTRELLE F. PARKER
*Acting Commissioner of Patents and Trademarks*

UNITED STATES PATENT AND TRADEMARK OFFICE
CERTIFICATE OF CORRECTION

PATENT NO. : 4,156,939
DATED : May 29, 1979
INVENTOR(S) : Takemae et al.

It is certified that error appears in the above—identified patent and that said Letters Patent is hereby corrected as shown below:

Claim 6, col. 11, line 44, change "regin" to --region--;

line 46, change "via" to --to--, and change "to" to --via--;

line 48, change "via" to --to--; and change "to" to --via--;

Claim 13, col. 12, line 42, change "via" to --to--; and change "to" to --via--;

line 47, change "via" to --to--; and change "to" to --via--.

Signed and Sealed this

Fifth Day of October 1982

[SEAL]

Attest:

Attesting Officer

GERALD J. MOSSINGHOFF
Commissioner of Patents and Trademarks